(12) United States Patent
Jain

(10) Patent No.: US 6,545,905 B2
(45) Date of Patent: Apr. 8, 2003

(54) MULTI-PORT MEMORY CELL WITH REFRESH PORT

(75) Inventor: Raj Kumar Jain, Singapore (SG)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/855,164

(22) Filed: May 14, 2001

(65) Prior Publication Data

US 2002/0167835 A1 Nov. 14, 2002

Related U.S. Application Data

(63) Continuation-in-part of application No. 09/806,299, filed on Jun. 3, 2001, and a continuation-in-part of application No. 09/806,395, filed on Dec. 6, 2001, and a continuation-in-part of application No. 09/615,987, filed on Jul. 14, 2000, now Pat. No. 6,304,478.

(51) Int. Cl.$^7$ .............................. G11C 11/40
(52) U.S. Cl. ...................... 365/154; 365/222
(58) Field of Search .................. 365/154, 155, 365/156, 222, 230.05, 104

(56) References Cited

U.S. PATENT DOCUMENTS 4,768,172 A * 8/1988 Sasaki ................ 365/154
5,040,146 A * 8/1991 Mattausch et al. ........ 365/154
6,118,689 A * 9/2000 Kuo et al. .............. 365/154

\* cited by examiner

Primary Examiner—Tan T. Nguyen
(74) Attorney, Agent, or Firm—Dexter Chin

(57) ABSTRACT

A memory cell having a plurality of first access transistors are coupled to a first terminal of the storage transistor and a second access transistors coupled to a second terminal of the storage transistor is disclosed. The access transistors serve as access ports for the memory cell.

17 Claims, 3 Drawing Sheets

MULTI-PORT MEMORY CELL WITH REFRESH PORT

This is a continuation-in-part of patent applications, titled: "Dual-Port Memory Cell", U.S. Ser. No. 09/806,299 filed Jun. 3, 2001; "Single-Port Memory Cell", U.S. Ser. No. 09/806,395 filed Dec. 6, 2001 and "Layout for a SemiConductor Memory", U.S. Ser. No. 09/615,987 filed Jul. 14, 2000 now U.S. Pat. No. 6,304,478.

FIELD OF THE INVENTION

The present invention relates generally to memory cells. More particularly, the invention relates to multi-port memory cells having improved performance.

BACKGROUND OF THE INVENTION

Integrated circuits (ICs) such as digital signal processors (DSPs) include on-chip memory to store information. The on-chip memory typically comprises, for example, an array of static random access memory (SRAM) cells connected by word lines in one direction and bit lines in another direction. The information stored in the SRAM cells are maintained until power is removed from the IC. Sense amplifiers are coupled to the bit lines to facilitate memory accesses, such as reads or writes. A sense amplifier is coupled to a pair of bit lines and senses a differential voltage indicative of the information stored in the selected memory cell on the bit line pair.

FIG. 1 shows a conventional SRAM cell 101. The SRAM cell comprises first and second transistors 110 and 120 coupled to a latch 130, which stores a bit of information. One transistor is coupled to a bit line 140 and the other is coupled to a bit line complement 141 while the gates are coupled to a word line 135. The latch includes first and second inverters 133 and 134, each implemented with two transistors. As such, the SRAM cell is realized using six transistors.

Smaller SRAM cells using less than six transistors have been proposed to reduce chip size. However, the charge stored in such cells dissipates overtime. In order to restore the information stored in the cell, a refresh operation is required. Typically, refreshing of memory cells interrupt the normal operation, adversely impacting performance.

As evidenced from the above discussion, it is desirable to provide an improved memory cell in which refresh operations do not adversely impact performance.

SUMMARY OF THE INVENTION

The present invention relates generally to memory cells. More particularly, the invention relates to multi-port memory cells. In one embodiment, the memory cell comprises a plurality of first access transistors coupled to a first terminal of a storage transistor and a second access transistor coupled to a second terminal of the storage transistor. Bit lines are coupled to the access transistors and word lines are coupled to the gates of access transistors. In one embodiment, one of the access transistors serve as a dedicated refresh port of the memory cell.

PREFERRED EMBODIMENTS OF THE INVENTION

Figure 1:
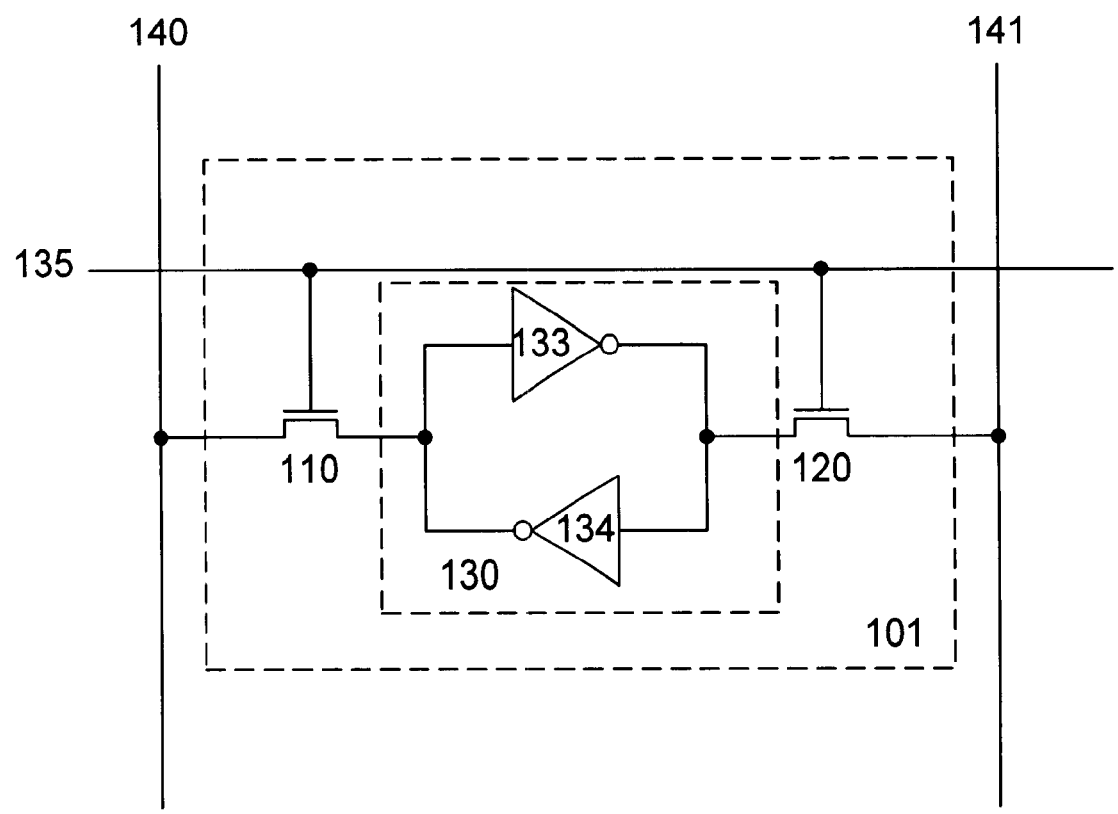
FIG. 1 shows a conventional SRAM cell.
Figure 2:
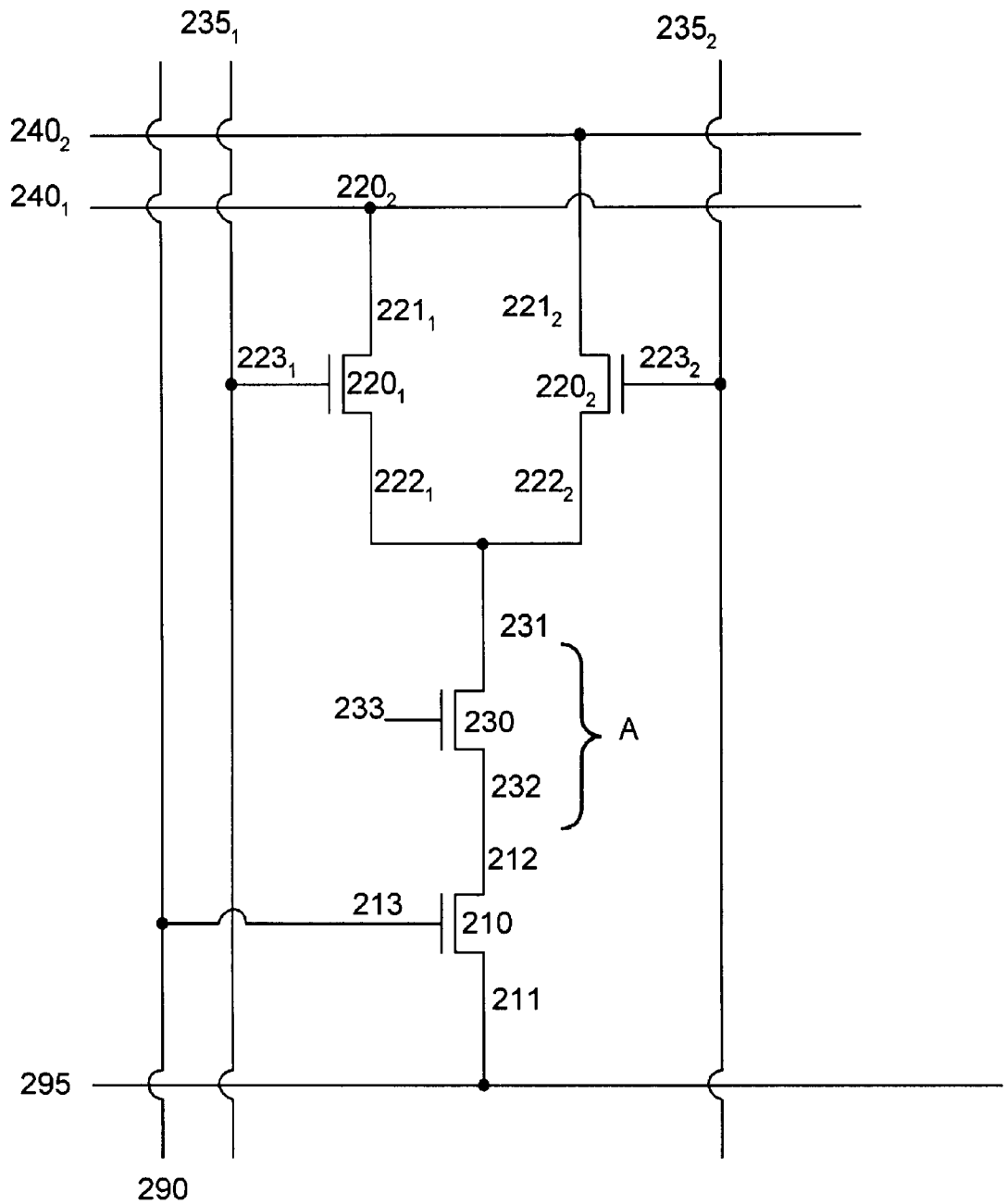
FIG. 2 shows a memory cell in accordance with one embodiment of the invention.

FIG. 2 shows a dual-port memory cell 101 in accordance with one embodiment of the invention. The memory cell comprises access transistors $220_{1-2}$ and a refresh access transistor 210 coupled to a storage transistor 230. The transistors, in one embodiment, are n-FETs. The use of p-FETs or a combination of n and p-FETs is also useful. The access transistors serve as memory access ports, each coupled to a bit line ($240_1$ or $241_2$) and a word line ($235_1$ or $235_2$). In one embodiment, the first access transistor's first terminal $221_1$ is coupled to the bit line $240_1$ and its gate $223_1$ is coupled to the word line $235_1$. Similarly, the second access transistor's first terminal $221_2$ is coupled to bit line $240_2$ and its gate $223_2$ is coupled to word line $235_2$. The memory cell can be accessed (read or write) either through the first or second port. Second terminals $222_{1-2}$ of the access transistors are coupled to a first terminal 231 of the storage transistor.

The refresh transistor is coupled to a refresh bit line 295 and a refresh word line 290. In one embodiment, the refresh transistor's first terminal 211 is coupled to the refresh bit line and its gate 213 is coupled to the refresh word line. A second terminal 212 is coupled to a second terminal 232 of the storage transistor. Alternatively, the refresh transistor can be coupled to the first terminal of the storage transistor and one of the access transistor is coupled to the second terminal of the storage transistor.

A gate 233 of the storage transistor is coupled to an active signal to keep the transistor in the on state (i.e., conductive) when the IC is in operation. In one embodiment, $V_{DD}$ is coupled to the gate of an n-FET storage transistor. When power is applied to the IC, the first and second terminals of the storage transistor are coupled together to form node A. The first and second terminals are isolated from each other when power is removed from the IC.

In an alternative embodiment, the gate of the storage transistor is coupled to a voltage greater than $V_{DD}$ to increase the charge stored by the storage transistor. Providing a voltage greater than $V_{DD}$ is described in concurrently filed U.S. patent application titled: "Memory Cell With Improved Retention Time", U.S. Ser. No. 09/855,167, which is herein incorporated by reference for all purpose.

A memory access can be performed via either the first or second port of the memory cell. An access to the first port is achieved by activating the word line $235_1$ (e.g., logic 1 for an n-FET and logic 0 for a p-FET) to render the first access transistor conductive. As a result, node A is coupled to the bit line via the first access transistor's first terminal $221_1$. The charge stored at node A is transferred to the bit line for a read access or the charge on the bit line is transferred to node A for a write access by write circuitry (not shown). Accessing the second port of the memory cell is achieved by selecting the word line $235_2$ coupled to the second access transistor to coupled node A to the bit line $240_2$. In one embodiment, a boosted voltage can be used to drive the word line.

Refreshing of the memory cell is accomplished using the refresh port of the memory cell. To perform a refresh, the refresh word line 290 is activated to couple node A to the refresh bit line. The charge stored in node A is sensed and restored. The refresh word line is deactivated upon completion of the refresh. In one embodiment, a boosted voltage can be used to activate the refresh word line. By providing a separate refresh port, refresh operations can be performed without hindering normal cell operations.

Figure 3:
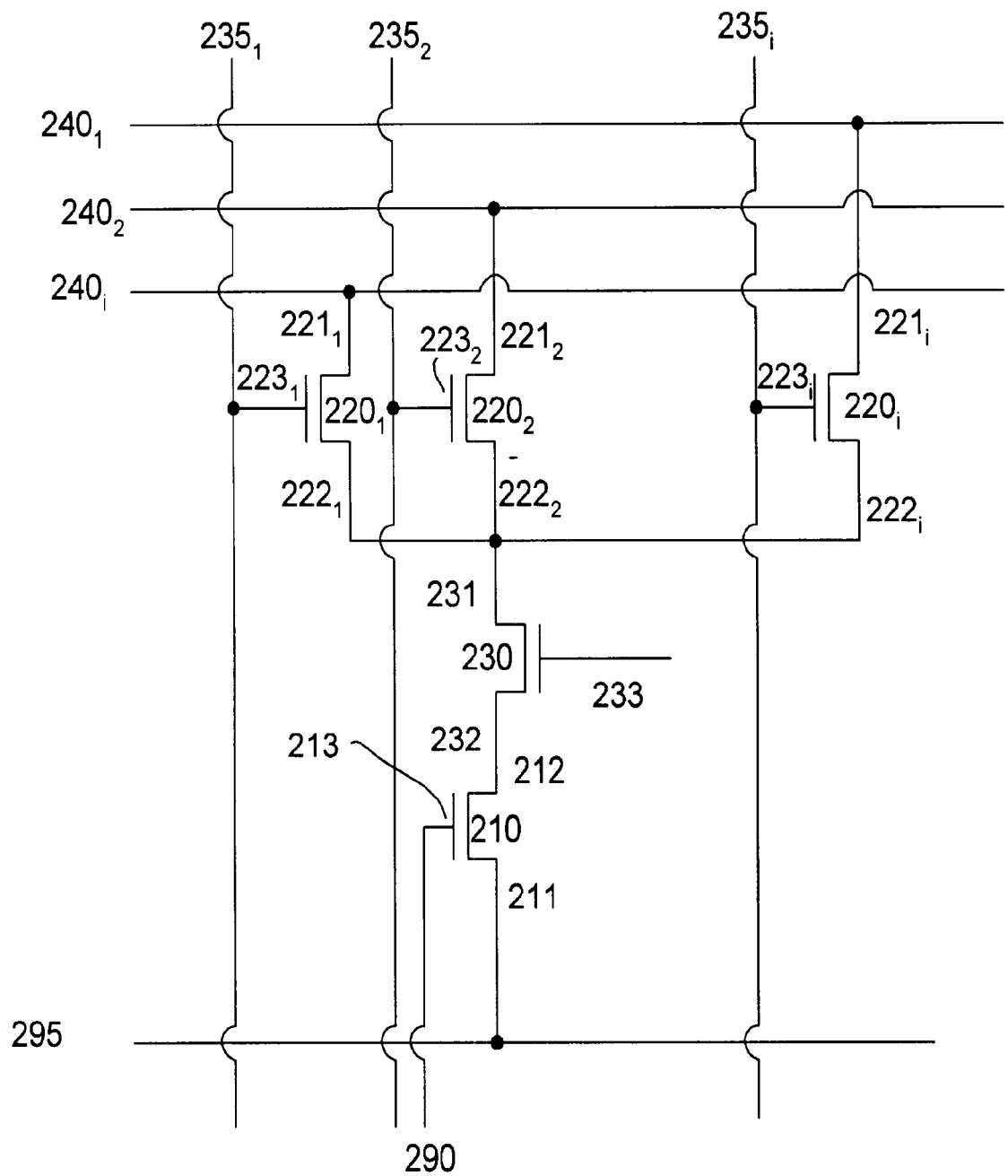
FIG. 3 shows a memory cell in accordance with another embodiment of the invention.

FIG. 3 shows a multi-port memory cell in accordance with another embodiment of the invention. The memory cell comprises access transistors $220_{1,2,\ldots i}$ and a refresh access transistor 210 coupled to a storage transistor 230. The access transistors serve as memory access ports, each coupled to a respective bit line ($240_{1,2,\ldots i}$) and a word line ($235_{1,2,\ldots i}$) In one embodiment, the access transistors' first terminals $221_{1,2,\ldots i}$ are coupled to the bit lines. The memory cell can be accessed (read or write) through any of the access ports. Second terminals $222_{1,2,\ldots i}$ of the access transistors are coupled to a first terminal 241 of the storage transistor.

The refresh transistor is coupled to a refresh bit line 295 and a refresh word line 290. In one embodiment, the refresh transistor's first terminal 211 is coupled to the refresh bit line and its gate 213 is coupled to the refresh word line. A second terminal 212 is coupled to a second terminal 232 of the storage transistor. Alternatively, the access and refresh transistors can be coupled to either the first or second terminal of the storage transistor, as long as at least one transistor is coupled to each terminal of the storage transistor.

A gate 233 of the storage transistor is coupled to an active signal to render the transistor conductive when the IC is in operation. In one embodiment, $V_{DD}$ is coupled to the gate of an n-FET storage transistor. Alternatively, the gate of the storage transistor is coupled to a voltage greater than $V_{DD}$. The operation of the multi-port memory cell is similar to the dual port cell described in FIG. 2.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A memory cell comprising:
   a storage transistor having a gate and first and second terminals, the first and second terminals respectively coupled to the second terminals of the first and second access transistors; and
   a plurality of first access transistors and a second access transistor, each having a gate and first and second terminals, the second terminals of the first access transistors coupled to the first terminal of the storage transistor, the second terminal of the second access transistor coupled to the second terminal of the storage transistor, the first terminals of the first and second access transistors coupled to respective bit lines, and the gates of the first and second transistors coupled to respective word lines.

2. The memory cell of claim 1 wherein one of the first or second access transistors serves as a refresh transistor.

3. The memory cell of claim 2 wherein the second access transistor serves as a refresh transistor.

4. The memory cell of claim 3 wherein the first access transistors serve as memory access ports.

5. The memory cell of claim 3 wherein the gate of the refresh transistor is coupled to a refresh word line.

6. The memory cell of claim 5 wherein the first terminal of the refresh transistor is coupled to a refresh bit line.

7. The memory cell of claim 6 wherein the gate of the storage transistor is coupled to an active signal.

8. The memory cell of claim 7 wherein the gate of the storage transistor is coupled to $V_{DD}$.

9. The memory cell of claim 7 wherein the gate of the storage transistor is coupled to a voltage greater than $V_{DD}$.

10. The memory cell of claim 2 wherein the gate of the refresh transistor is coupled to a refresh word line.

11. The memory cell of claim 10 wherein the first terminal of the refresh transistor is coupled to a refresh bit line.

12. The memory cell of claim 11 wherein the gate of the storage transistor is coupled to an active signal.

13. The memory cell of claim 12 wherein the gate of the storage transistor is coupled to $V_{DD}$.

14. The memory cell of claim 12 wherein the gate of the storage transistor is coupled to a voltage greater than $V_{DD}$.

15. The memory cell of claim 1 wherein the gate of the storage transistor is coupled to an active signal.

16. The memory cell of claim 15 wherein the gate of the storage transistor is coupled to $V_{DD}$.

17. The memory cell of claim 15 wherein the gate of the storage transistor is coupled to a voltage greater than $V_{DD}$.

* * * * *